(12) United States Patent
Jin et al.

(10) Patent No.: US 10,657,349 B2
(45) Date of Patent: May 19, 2020

(54) ULTRASONIC MODULE AND METHOD FOR MANUFACTURING THE SAME

(71) Applicants: J-METRICS TECHNOLOGY Co., Ltd., Shenzhen, Guangdong (CN); Peking University Shenzhen Graduate School, Shenzhen (CN)

(72) Inventors: Yu-Feng Jin, Shenzhen (CN); Sheng-Lin Ma, Shenzhen (CN); Qian-Cheng Zhao, Shenzhen (CN); Huan Liu, Shenzhen (CN); Yi-Hsiang Chiu, Shenzhen (CN)

(73) Assignees: J-METRICS TECHNOLOGY CO., LTD., Shenzhen, Guangdong (CN); PEKING UNIVERSITY SHENZHEN GRADUATE SCHOOL, Shenzhen (CN)

( * ) Notice: Subject to any disclaimer, the term of this patent is extended or adjusted under 35 U.S.C. 154(b) by 142 days.

(21) Appl. No.: 16/105,501

(22) Filed: Aug. 20, 2018

(65) Prior Publication Data
US 2019/0080132 A1    Mar. 14, 2019

(30) Foreign Application Priority Data

Sep. 8, 2017    (CN) ............................ 2017 1 0803335

(51) Int. Cl.
*G06K 9/00*    (2006.01)
*B06B 1/02*    (2006.01)
(Continued)

(52) U.S. Cl.
CPC .......... *G06K 9/0002* (2013.01); *B06B 1/0207* (2013.01); *B06B 1/0611* (2013.01); *B06B 1/0622* (2013.01); *H01L 41/042* (2013.01); *H01L 41/0474* (2013.01); *H01L 41/0475* (2013.01); *H01L 41/053* (2013.01);
(Continued)

(58) Field of Classification Search
CPC ... G06K 9/0002; B06B 1/0207; B06B 1/0611; B06B 1/0622; H01L 41/042
See application file for complete search history.

(56) References Cited

U.S. PATENT DOCUMENTS

2014/0352440 A1* 12/2014 Fennell ................ G01N 29/22
                                                    73/632
2015/0165479 A1*  6/2015 Lasiter ................ B06B 1/0666
                                                    310/322
(Continued)

*Primary Examiner* — Utpal D Shah
(74) *Attorney, Agent, or Firm* — Muncy, Geissler, Olds & Lowe, P.C.

(57) ABSTRACT

An ultrasonic module and a manufacturing method for ultrasonic module are provided. The ultrasonic module includes a substrate, a composite layer, and a covering layer. The substrate has an upper surface. The composite layer has a top surface, a bottom surface, and a recessed surface recessed toward the bottom surface. The bottom surface is on the upper surface of the substrate. One or more space is formed between the recessed surface and the upper surface. The composite layer has one or more first groove extending from the top surface toward the recessed surface. The first groove separates the composite layer into a circuit structure and an ultrasonic structure connected to the circuit structure. The covering layer is assembled on the top surface of the composite layer.

16 Claims, 12 Drawing Sheets

(51) Int. Cl.
  *B06B 1/06* (2006.01)
  *H01L 41/04* (2006.01)
  *H01L 41/047* (2006.01)
  *H01L 41/083* (2006.01)
  *H01L 41/08* (2006.01)
  *H01L 41/23* (2013.01)
  *H01L 41/25* (2013.01)
  *H01L 41/29* (2013.01)
  *H01L 41/053* (2006.01)

(52) U.S. Cl.
  CPC ........ *H01L 41/083* (2013.01); *H01L 41/0825* (2013.01); *H01L 41/23* (2013.01); *H01L 41/25* (2013.01); *H01L 41/29* (2013.01); *B06B 2201/70* (2013.01)

(56) References Cited

U.S. PATENT DOCUMENTS

| | | | |
|---|---|---|---|
| 2016/0041047 A1* | 2/2016 | Liu | G01L 1/165 73/862.046 |
| 2016/0117541 A1* | 4/2016 | Lu | G06K 9/0002 382/124 |
| 2016/0351465 A1* | 12/2016 | Chuang | G06F 3/0416 |
| 2017/0110504 A1* | 4/2017 | Panchawagh | H01L 27/20 |
| 2017/0155029 A1* | 6/2017 | Kiyose | H01L 41/0825 |
| 2017/0323133 A1* | 11/2017 | Tsai | G06K 9/0002 |
| 2018/0107854 A1* | 4/2018 | Tsai | B81C 1/00238 |
| 2018/0277742 A1* | 9/2018 | Yonemura | B41J 2/14233 |
| 2018/0369866 A1* | 12/2018 | Sammoura | G06F 3/0416 |
| 2019/0008479 A1* | 1/2019 | Nakayama | B06B 1/06 |
| 2019/0043920 A1* | 2/2019 | Berger | H01L 41/1138 |
| 2019/0073045 A1* | 3/2019 | Lei | G06K 9/00006 |
| 2019/0197284 A1* | 6/2019 | Park | G06F 3/017 |

* cited by examiner

ULTRASONIC MODULE AND METHOD FOR MANUFACTURING THE SAME

CROSS-REFERENCE TO RELATED APPLICATION

This non-provisional application claims priority under 35 U.S.C. § 119(a) to Patent Application No. 201710803335.0 filed in China, P.R.C. on Sep. 8, 2017, the entire contents of which are hereby incorporated by reference.

BACKGROUND

Technical Field

The instant disclosure relates to techniques for transmitting ultrasonic waves, in particular, to an ultrasonic module and a method for manufacturing the ultrasonic module.

Related Art

Along with developments of related technologies, mobile phones, notebook computer, and tablet computers already become essential tools in our daily lives. People are already used to store their important or personal information in these smart electronic devices, and functions and application programs for these smart electronic devices are also developed in a customized manner. To prevent such important information from being stolen or embezzled, fingerprint recognition techniques are widely utilized in smart electronic devices to identify the users.

Ultrasonic fingerprint recognition techniques are already applied to the smart electronic devices. In general, when an ultrasonic module is used in a smart electronic device, the user touches an upper cover of the ultrasonic module or touches the screen protection layer of the smart electronic device, so that the ultrasonic module transmits ultrasonic signals to the user's finger and receives reflected ultrasonic signals with different intensities respectively reflected by the peaks and valleys of the user's finger. Hence, the fingerprint of the user can be identified. However, the ultrasonic signals of the ultrasonic module may be transmitted to a region that is not in contact with the user's finger via a dielectric. As a result, the reflected ultrasonic signals received by the ultrasonic module may not be reflected by the user's finger, and the fingerprint of the user would not be recognized properly.

SUMMARY

An embodiment of the instant disclosure provides an ultrasonic module. The ultrasonic module comprises a substrate, a composite layer, and a covering layer. The substrate has an upper surface and a lower surface opposite to the upper surface. The composite layer has a top surface, a bottom surface, and a recessed surface recessed toward the bottom surface. The bottom surface is on the upper surface of the substrate. At least one space is formed between the recessed surface and the upper surface. The composite layer has at least one first groove extending from the top surface toward the recessed surface. The at least one first groove separates the composite layer into a circuit structure and an ultrasonic structure connected to the circuit structure. The covering layer is assembled on the top surface of the composite layer.

An embodiment of the instant disclosure provides a manufacturing method for ultrasonic module. The method comprises forming a circuit layer on a first base plate; forming a patterned protection layer to cover parts of the upper surface of the circuit layer and not to cover a first removal structure exposed from the upper surface of the circuit layer; removing the first removal structure to form a first upper groove; removing parts of the first base plate in the first upper groove from the upper surface of the first base plate toward the lower surface of the first base plate to form a first lower groove in communication with the first upper groove; removing at least one portion of the first base plate corresponding to the ultrasonic region from the lower surface of the first base plate toward the upper surface of the first base plate to allow the lower surface of the first base plate to have at least one recessed surface corresponding to the ultrasonic region; forming a substrate on the lower surface of the first base plat to allow at least one space is formed between the recessed surface and an upper surface of the substrate; and assembling the covering layer on the upper surface of the circuit layer. In this embodiment, the circuit layer comprises a circuit region, an ultrasonic region, and at least one first removal structure. Wherein, the at least one first removal structure is exposed from the upper surface of the circuit layer and extending from the upper surface of the circuit layer toward the lower surface of the circuit layer. A portion of the periphery of the ultrasonic region is surrounded by the at least one first removal structure, and a rest portion of the periphery of the ultrasonic region is connected to the circuit region.

According to the ultrasonic module and the manufacturing method of the ultrasonic module of the embodiments of the instant disclosure, a space is formed below the ultrasonic structure and in communication with the first groove (and/or the second groove) to form a communicating spacing extending from the top surface of the composite layer toward the upper surface of the substrate. Therefore, the communicating spacing allows the transmission speed of the first ultrasonic signal to be different from the transmission speed of the second ultrasonic signal, so that the second ultrasonic signal can be distinguished and removed, and the first ultrasonic signal can be received. Therefore, the first ultrasonic signal can be used for recognizing the fingerprint on the covering layer without the interference from the second ultrasonic signal, so that the accuracy of the fingerprint recognition can be improved.

BRIEF DESCRIPTION OF THE DRAWINGS

The disclosure will become more fully understood from the detailed description given herein below for illustration only, and thus not limitative of the disclosure, wherein.

DETAILED DESCRIPTION

Figure 1:
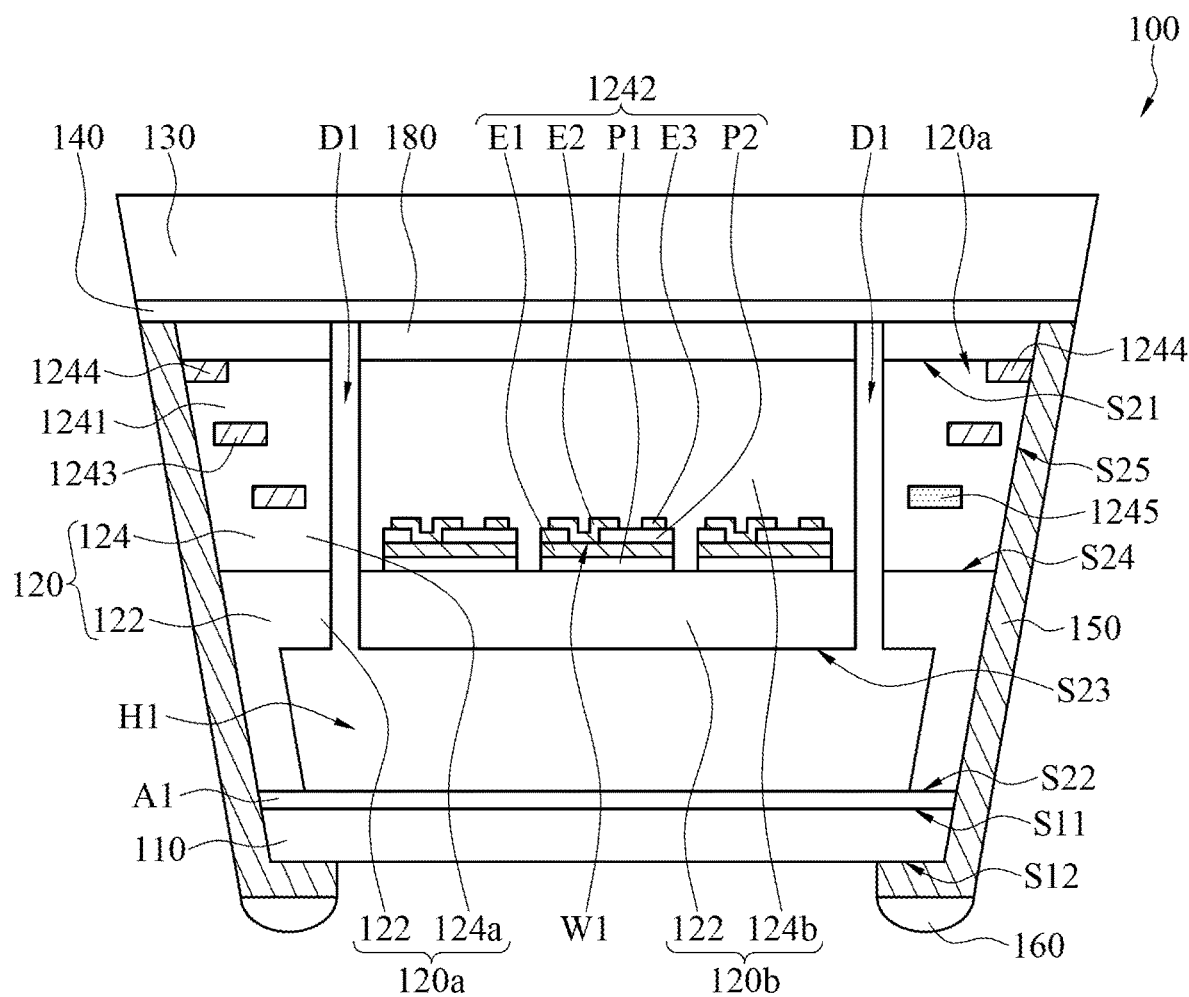
FIG. 1 illustrates a schematic structural view of an ultrasonic module according to an exemplary embodiment of the instant disclosure.

FIG. 1 illustrates a schematic structural view of an ultrasonic module according to an exemplary embodiment of the instant disclosure. Please refer to FIG. 1. The ultrasonic module 100 comprises a substrate 110, a composite layer 120, and a covering layer 130. The composite layer 120 is on the substrate 110. The covering layer 130 is assembled on a top surface of the composite layer 120.

The substrate 110 has an upper surface S11 and a lower surface S12 opposite to the upper surface S11, and the substrate 110 is used for loading the composite layer 120. In one embodiment, the substrate 110 may be a silicon base plate, a glass base plate, a sapphire base plate, a plastic base plate or other additional circuit boards with supporting functions.

The composite layer 120 is on the substrate 110. The composite layer 120 has a top surface S21, a bottom surface S22, and a recessed surface S23 recessed toward the bottom surface S22. The bottom surface S22 of the composite layer 120 is on the upper surface S11 of the substrate 110. In one embodiment, the bottom surface S22 may be in contact with the upper surface S11 of the substrate 110 via an adhesive material layer A1 like a double-sided tape, an adhesive ink, an adhesive paint, etc. In this embodiment, at least one space H1 is formed between the recessed surface S23 and the upper surface S11 of the substrate 110. It is noted that, one or a plurality of incommunicable spaces may be formed between the recessed surface S23 and the upper surface S11 of the substrate 110. In this embodiment, as shown in FIG. 1, a space H1 is formed between the recessed surface S23 and the upper surface S11.

The composite layer 120 has at least one first groove D1, and the at least one first groove D1 is extending from the top surface S21 toward the recessed surface S23. In this embodiment, the at least one first groove D1 is in communication with the space D1. The at least one first groove D1 surrounds a portion of a periphery of the ultrasonic structure 120b, and a rest portion of the periphery of the ultrasonic structure 120b (i.e., the portion of the periphery of the ultrasonic structure 120b that is not surrounded by the at least one first groove D1) is connected to the circuit structure 120a. In one embodiment, the at least one first groove D1 separates the composite layer 120 into a circuit structure 120a and an ultrasonic structure 120b hangingly connected to the circuit structure 120a. Accordingly, in this embodiment, the at least one first groove D1 prevents the signal interferences between the ultrasonic signals of the ultrasonic components 1242 of the ultrasonic module 100 and the signals of the electronic components. The ultrasonic structure 120b corresponds to the space H1 and the ultrasonic structure 120b is above the space H1. In other words, a projection of the ultrasonic structure 120b is overlapping on a projection of the space H1 in an orthogonal projecting direction of the substrate 110.

In one embodiment, the composite layer 120 comprises a first base plate 122 and a circuit layer 124 on the first base plate 122. The top surface S21 of the composite layer 120 is substantially an upper surface of the circuit layer 124, and the bottom surface S22 and the recessed surface S23 of the composite layer 120 are substantially a lower surface of the first base plate 122. In one embodiment, the first base plate 122 is a wafer. In another embodiment, the circuit layer 124 comprises a dielectric material layer 1241, at least one or a plurality of ultrasonic components 1242, a circuit layout 1243, and at least one connection pad 1244. The ultrasonic component 1242, the circuit layout 1243, and the connection pad 1244 are distributed in the dielectric material layer 1241.

The ultrasonic components 1242 are aligned as a two-dimensional array. Each of the ultrasonic components 1242 comprises a first piezoelectric layer P1, a second piezoelectric layer P2, a first electrode E1, a second electrode E2, and a third electrode E3. The second piezoelectric layer P2 is on the first piezoelectric layer P1 and the second piezoelectric layer P2 has a contact hole W1. The first electrode E1 is between the first piezoelectric layer P1 and the second piezoelectric layer P2, and the contact hole W1 exposes parts of the first electrode E1. The second electrode E2 is on the second piezoelectric layer P2 and is in contact with the first electrode E1 through the contact hole W1. The third electrode E3 is on the second piezoelectric layer P2.

The circuit layout 1243 is used as wires for electrically connecting the ultrasonic components 1242 with each other and/or electrically connecting the ultrasonic components 1242 with other components. At least one of the surfaces of the connection pad 1244 is exposed from a lateral surface of the composite layer 120 (in this embodiment, the connection pad 1244 is exposed from a lateral surface of the circuit structure 120a, as shown in FIG. 1), so that the connection pad 1244 can be electrically connected to external circuits. In practice, the connection pad 1244 may be electrically connected at least parts of the circuit layout 1243 according to electrical connection requirements.

In this embodiment, the ultrasonic structure 120b is a region of the composite layer 120 where the ultrasonic component 1242 is distributed. That is, the ultrasonic structure 120b comprises an ultrasonic region 124b located at the circuit layer 124 and the first base plate 122 corresponding to the ultrasonic region 124b. The circuit structure 120a is a region of the composite layer 120 where the circuit layout 1243 and the connection pad 1244 are approximately distributed. That is, the circuit structure 120a comprises a circuit region 124a located at the circuit layer 124 and the first base plate 122 corresponding to the circuit region 124a. In one embodiment, the ultrasonic structure 120b is suspended above the space H1. In other words, the lower surface of the first base plate 122 of the ultrasonic structure 120b (i.e., the recessed surface S23 of the composite layer 120) is not in contact with the upper surface S11 of the substrate 110. In one embodiment, the lower surface of the first base plate 122 located at the circuit structure 120a (i.e., the bottom surface S22 of the composite layer 120) is in contact with the upper surface S11 of the substrate 110.

In one embodiment, the ultrasonic module 100 comprises a conductor layer 150 and a conductive pad 160. The conductor layer 150 is on a lateral surface S25 of the circuit structure 120a and extending toward the lower surface S12 of the substrate 110, and the conductor layer 150 is electrically connected to the connection pad 1244. A portion of the connection pad 1244 is exposed from the lateral surface S25 of the circuit structure 120a. In one embodiment, a side surface of the connection pad 1244 is exposed from the lateral surface S25 of the circuit structure 120a. The conductive pad 160 is on the lower surface S12 of the substrate 110. In one embodiment, the conductive pad 160 is above the conductor layer 150 which is extending toward the lower surface S12. In this embodiment, the connection pad 1244 can be electrically connected to the conductive pad 160 through the conductor layer 150, so that the components (e.g., the ultrasonic component 1242) can be electrically connected to external circuits.

The covering layer 130 is combined with the top surface S21 of the composite layer 120 (i.e., the upper surface of the circuit layer 124). In this embodiment, the first groove D1 is in communication with the space H1, and the communicating spacing between the first groove D1 and the space H1 can be considered as a spacing extending from the top surface S21 of the composite layer 120 toward the upper surface S11 of the substrate 110. The covering layer 130 is used as a covering plate for the whole module. The covering layer 130 is provided for user's touching, and the covering layer 130 is used for shielding the communicating spacing between the first groove D1 and the space H1 to prevent small particles falling into the communicating spacing. In one embodiment, the covering layer 130 may be a glass substrate, a plastic substrate, a silicon substrate, a sapphire substrate, etc. In another embodiment, the covering layer 130 may also be a screen or a covering plate used for an electronic device (e.g., the covering layer may be a touch function-equipped covering plate of a touch device).

In one embodiment, the ultrasonic module 100 further comprises an adhesive layer 140. The adhesive layer 140 is between the covering layer 130 and the composite layer 120, and the covering layer 130 is assembled on the top surface S21 of the composite layer 120 via the adhesive layer 140. In detail, the adhesive layer 140 is an adhesive material and can be applied on the covering layer 130 or on the top surface S21 of the composite layer 120. The covering layer 130 can be combined with the composite layer 120 via the adhesive layer 140.

Figure 2:
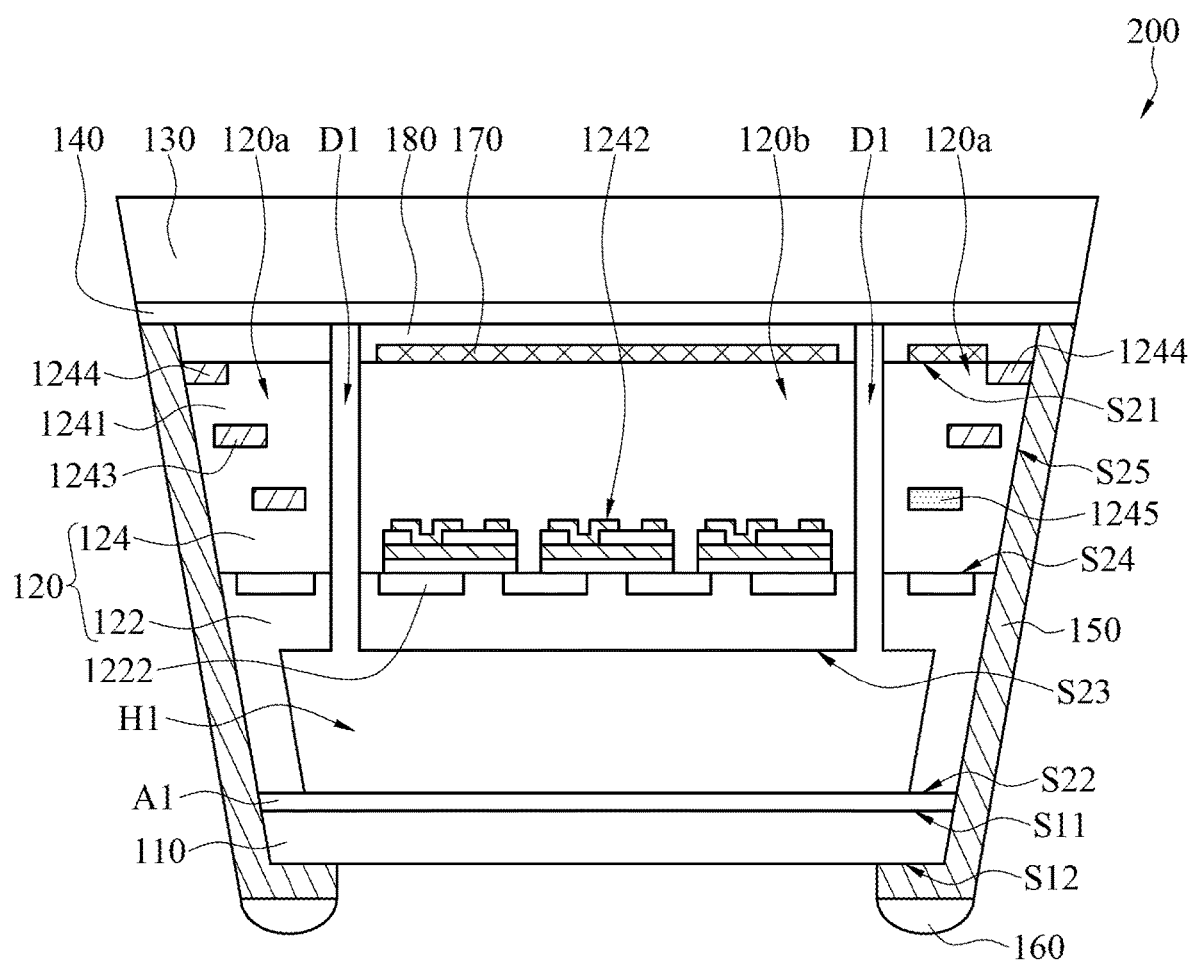
FIG. 2 illustrates a schematic structural view of an ultrasonic module according to another embodiment of the instant disclosure.

In another embodiment, the composite layer 120 may further comprise at least one light-sensing component 1222. FIG. 2 illustrates a schematic structural view of an ultrasonic module 200 according to another embodiment of the instant disclosure. In one embodiment, the light-sensing component 1222 of the ultrasonic module 200 is in the first base plate 122. Wherein, the light-sensing component 1222 may be below the circuit structure 120a and/or below the ultrasonic structure 120b. In another embodiment, the ultrasonic module 200 comprises a plurality of light-sensing components 1222 aligned as a two-dimensional array. The array of the light-sensing components 1222 is below the array of the ultrasonic components 1242. Wherein, the position of the array of the light-sensing components 1222 may or may not correspond to the array of the ultrasonic components 1242.

In one further embodiment, the ultrasonic module 200 may further comprise at least one light-filtering layer 170. As shown in FIG. 2, the light-filtering layer 170 is on the top surface S21 of the composite layer 120 and corresponds to the light-sensing component 1222. In this embodiment, the light-filtering layer 170 is on the top surface S21 of the composite layer 120. In another embodiment, the light-filtering layer 170 may be on the covering layer 130. In this embodiment, when the lights emitted by the light-sensing component 1222 enter into the light-filtering layer 170, lights within certain wavelength ranges are permitted to pass through the light-filtering layer 170. For example, the light-filtering layer 170 may be designed to allow infrared lights or green lights to pass through it. Furthermore, the light-filtering layers 170 at different positions may have the same or different filtering properties. In other words, lights with the same wavelength may respectively pass through the light-filtering layers 170 at different positions, or lights with different wavelengths may respectively pass through the light-filtering layers 170 at different positions.

Figure 3:
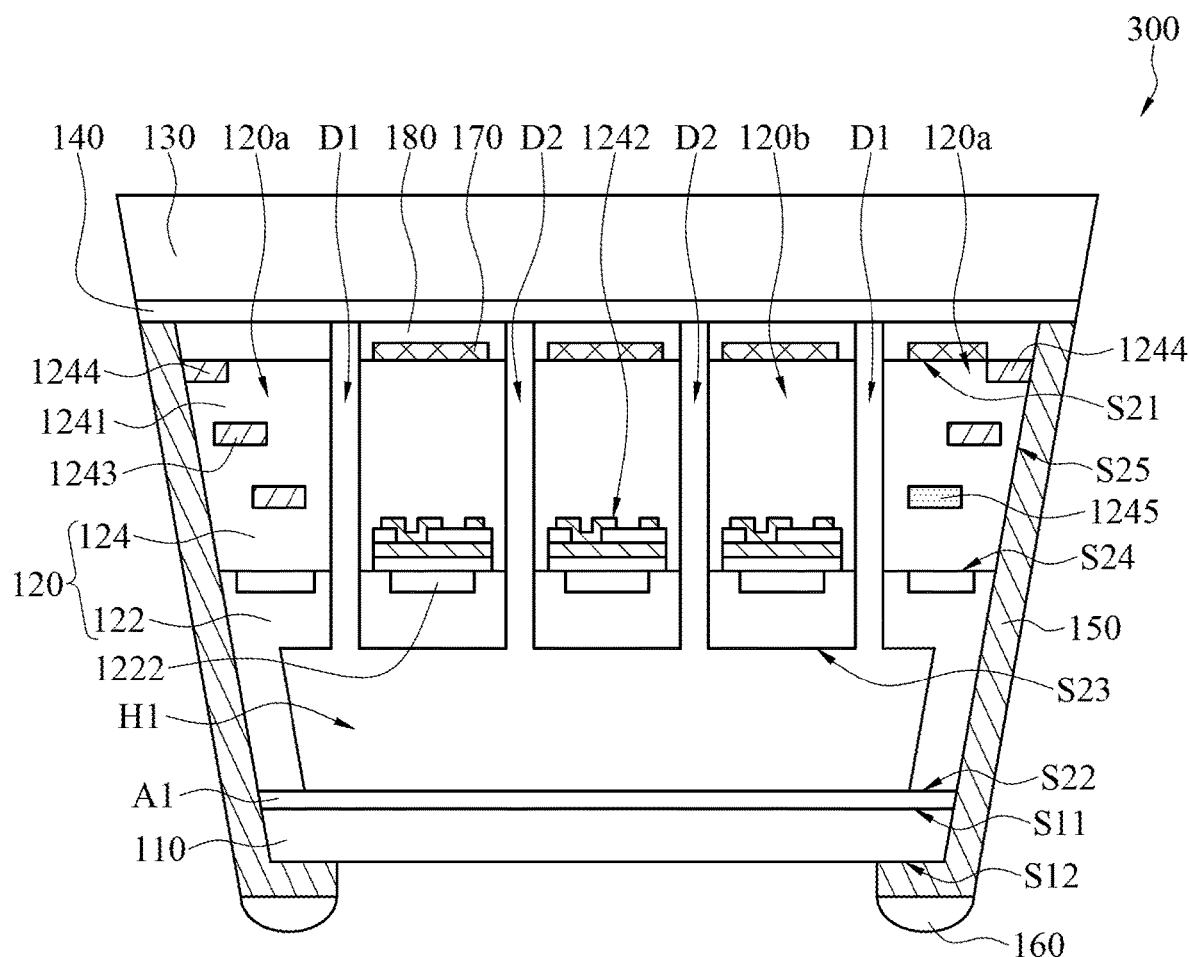
FIG. 3 illustrates a schematic structural view of an ultrasonic module according to yet another embodiment of the instant disclosure.

In another embodiment, the composite layer 120 may further comprise at least one second groove D2. FIG. 3 illustrates a schematic structural view of an ultrasonic module 300 according to yet another embodiment of the instant disclosure. As shown in FIG. 3, the ultrasonic module 300 further comprises at least one second groove D2, and the at least one second groove D2 is in the ultrasonic structure 300 of the composite layer 120. In one embodiment, the composite layer 120 comprises a plurality of second grooves D2, and the second grooves D2 are in the ultrasonic structure 300. Each of the second grooves D2 is extending from the top surface S21 toward the recessed surface S23 and in communication with the space H1. Each of the second grooves D2 surround a portion of a periphery of one of the ultrasonic components 1242, and a rest portion of the periphery of the ultrasonic component 1242 (i.e., the peripheral portion of the ultrasonic component 1242 that is not surrounded by the second groove D2) is connected to other regions of the ultrasonic structure 120b or connected to the circuit structure 120a. In other words, one of the second grooves D2 separates at least two adjacent ultrasonic components 1242 of the ultrasonic components 1242.

It is understood that, because the covering layer 130 is combined with the top surface S21 of the composite layer 120 (i.e., the upper surface of the circuit layer 124), in one embodiment, the first groove D1 is in communication with the space H1 to form a communicating spacing extending from the top surface S21 of the composite layer 120 toward the upper surface S11 of the substrate 110 (as shown in FIG. 1), and in another embodiment, the first groove D1, the second groove D2, and the space H1 are in communication with each other to form a communicating spacing extending from the top surface S21 of the composite layer 120 toward the upper surface S11 of the substrate 110 (as shown in FIG. 3). In other words, the communicating spacing is not distributed between the ultrasonic structure 120b and the covering layer 130. Therefore, a first ultrasonic signal emitted by the ultrasonic component 1242 toward the covering layer 130 is approximately transmitted via solid media (e.g., the dielectric material layer 1241, the covering layer 130, the finger), and a second ultrasonic signal emitted by the ultrasonic component 1242 toward the substrate 110 is approximately transmitted via gaseous and/or solid media (e.g., the first base plate 122, the space H1, the substrate 110).

In other words, the first ultrasonic signal is transmitted via the same type media (i.e., the solid media), and the second ultrasonic signal is transmitted via different type media (i.e., the gaseous media and/or the solid media). Accordingly, the speed of the first ultrasonic signal transmitted via the dielectric material layer 1241 and the covering layer 130 and reflected by the finger is different from the speed of the second ultrasonic signal transmitted via the first base plate 122 and air in the space H1 and reflected by the substrate 110. The communicating spacing allows the transmission speed of the first ultrasonic signal to be different from the transmission speed of the second ultrasonic signal, so that the second ultrasonic signal can be distinguished and removed, and the first ultrasonic signal can be received. Therefore, the first ultrasonic signal can be used for recognizing the fingerprint on the covering layer 130 without the interference from the second ultrasonic signal, so that the accuracy of the fingerprint recognition can be improved.

Figure 4:
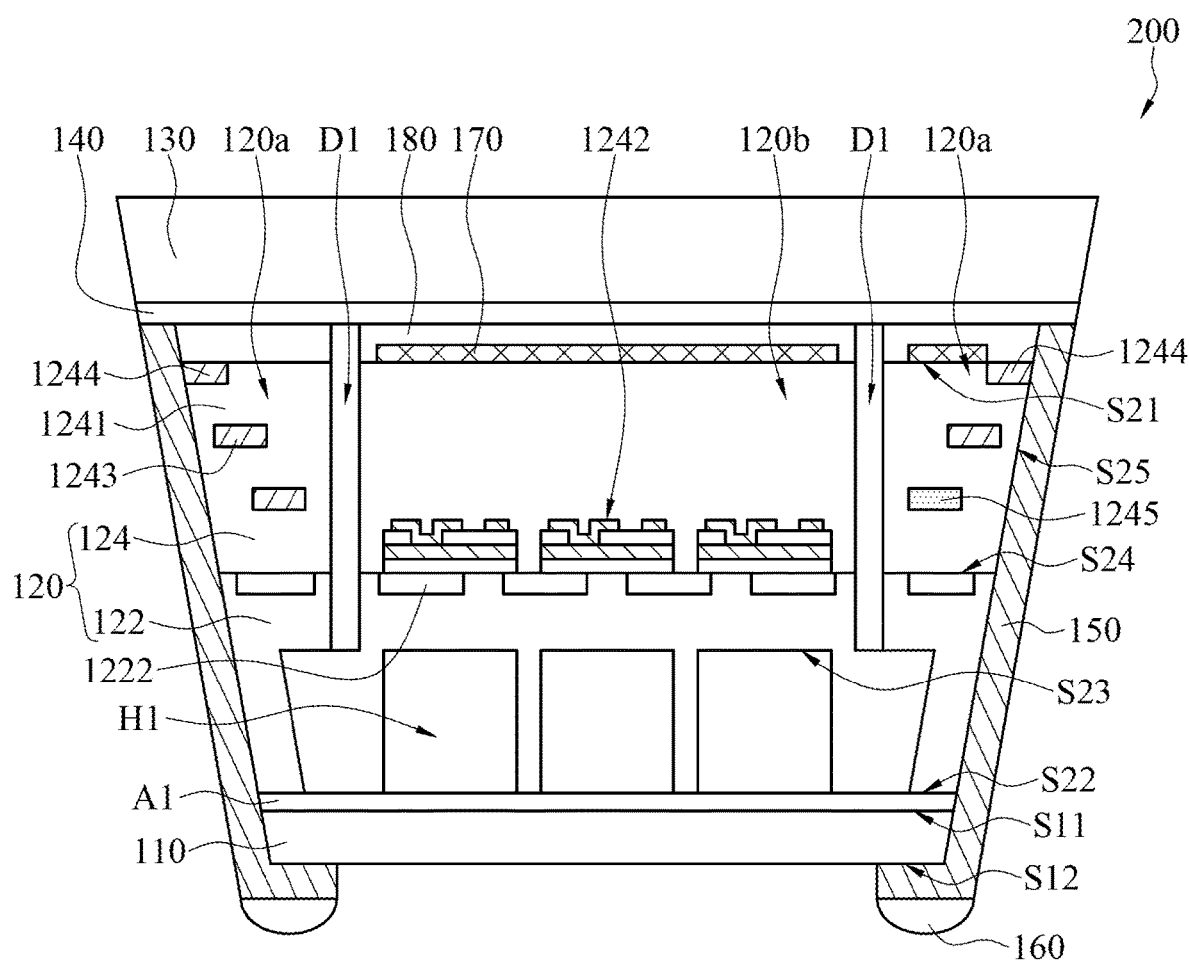
FIG. 4 illustrates a schematic structural view of an ultrasonic module according to further yet another embodiment of the instant disclosure.

In further yet another embodiment, a plurality of spaces H1 is formed between the recessed surface S23 and the upper surface S11 of the substrate 110, and the spaces H1 are not in communication with each other. As shown in FIG. 4, the ultrasonic structure 120b is above the spaces H1 and the spaces H1 respectively correspond to the ultrasonic components 1242. In this embodiment, the spaces H1 allow the transmission speed of the first ultrasonic signal of each of the ultrasonic components 1242 to be different from the transmission speed of the second ultrasonic signal of each of the ultrasonic components 1242. The first groove D1 divides the composite layer 120 into the circuit structure 120a and the ultrasonic structure 120b connected to the circuit structure 120a. In this embodiment, the first groove D1 can be used for preventing the interference between the ultrasonic signals of the ultrasonic component 1242 and the signals of electronic components. In one embodiment, the first groove D1 may be not in communication with the spaces H1, as shown in FIG. 4. In another embodiment, the first groove D1 may be in communication with the spaces H1.

Figure 5A:
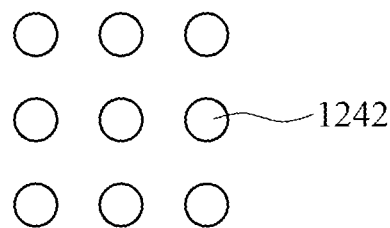
FIGS. 5A to 5C illustrate partial schematic top structural views of ultrasonic components of one embodiment of the ultrasonic module.
Figure 5B:
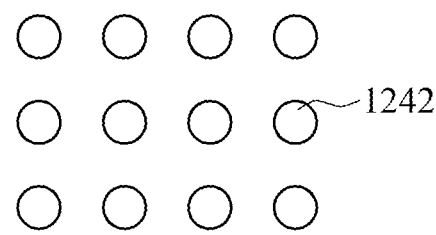
Figure 5C:
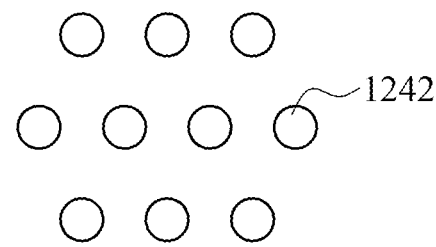

Furthermore, in one embodiment, the ultrasonic component 1242 may be used for transmission of audio messages by taking the ultrasonic signal as the carrier of the audio messages. Wherein, the ultrasonic component 1242 may be used for delivering a sound to a certain region of the environment by taking the ultrasonic signal as the carrier of the sound. In one embodiment, the ultrasonic components 1242 in the two-dimensional array may have different shapes, e.g., a square shape, a rectangle shape, or a hexagonal shape, as shown in FIGS. 5A to 5C. It is understood that, the number of the ultrasonic components 1242 are not limited thereto. The ultrasonic components 1242 with different shapes allow the beams of the ultrasonic signals of the ultrasonic components 1242 to be superimposed with each other, so that the ultrasonic components 1242 can perform a better directivity.

In another embodiment, the ultrasonic signal generated by the ultrasonic component 1242 is reflected by the peaks and the valleys of the fingerprint, so that the fingerprint can be recognized via the reflected ultrasonic signal. Furthermore, in a similar manner, the user's palm can be recognized via the reflected ultrasonic signal, so that hand-gesture recognitions can be achieved.

In yet another embodiment, the light-sensing component 1222 may be an infrared sensor and is used for measuring a distance between an object and the ultrasonic module. Alternatively, the light-sensing component 1222 may be a thermal sensor and is used for detecting the distance between an object (or a human body) and the light-sensing component 1222 or the moving direction of the object (or the human body). In this embodiment, the light-sensing component 1222 can detect the distance between the ultrasonic module and an object (or a human body) near the ultrasonic module or can detect the moving direction of the object (or the human body), and the light-sensing component 1222 can thus generate a distance signal or a direction signal and send the signal to the ultrasonic component 1242. Hence, the ultrasonic component 1242 can generate the ultrasonic signal toward the certain object or human body according to the distance signal or the direction signal.

FIGS. 6A to 6H illustrate schematic views showing the steps of the manufacturing method of the ultrasonic module of one embodiment of the instant disclosure.

Figure 6A:
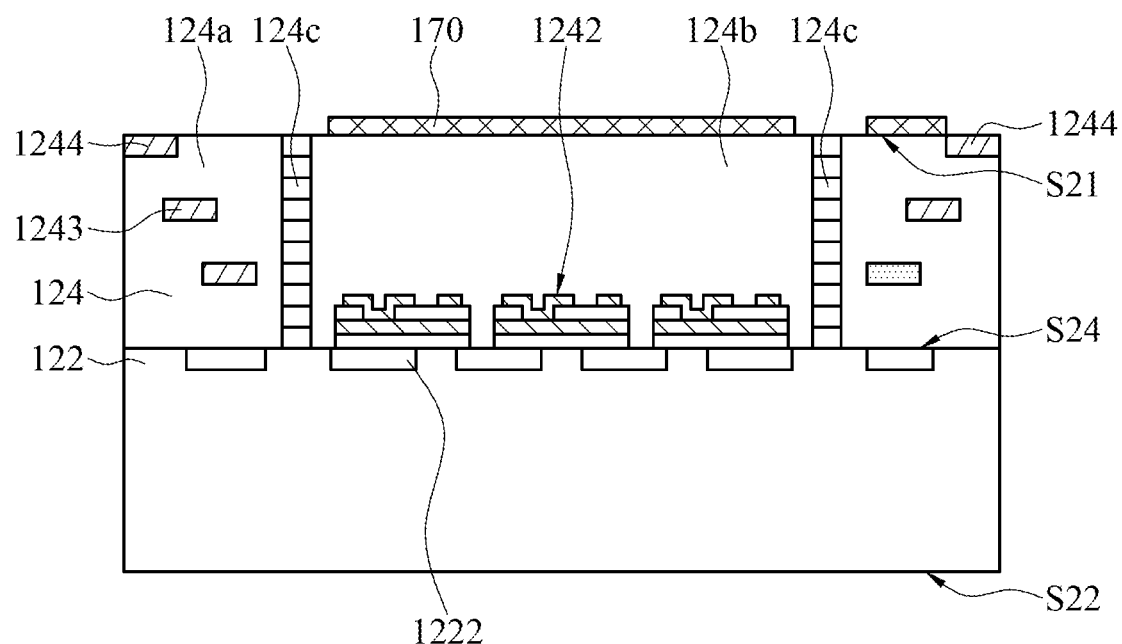
FIGS. 6A to 6H illustrate schematic views showing the steps of the manufacturing method of the ultrasonic module of the exemplary embodiment.

First, as shown in FIG. 6A, a circuit layer 124 is formed on an upper surface S24 of a first base plate 122. Wherein, the circuit layer 124 comprises a circuit region 124a, an ultrasonic region 124b, and at least one first removal structure 124c. In this embodiment, the circuit region 124a is a region of the circuit layer 124 where a circuit layout 1243 and a connection pad 1244 are approximately distributed, and the ultrasonic region 124b is a region of the circuit layer 124 where an ultrasonic component 1242 is distributed. The first removal structure 124c is exposed from the upper surface of the circuit layer 124 (i.e., the top surface S21 of a composite layer 120), and the first removal structure 124c is extending from the upper surface of the circuit layer 124 toward the lower surface of the circuit layer 124. A portion of the periphery of the ultrasonic region 124b is surrounded by the first removal structure 124c and a rest portion of the periphery of the ultrasonic region 124b is connected to the circuit region 124a. In other words, the first removal structure 124c separates the circuit layer 124 as the circuit region 124a and the ultrasonic region 124b connected to the circuit region 124a.

In one embodiment, the circuit layer may 124 comprise at least one light-sensing component 1222. As shown in FIG. 6A, the circuit layer 124 comprises a plurality of light-sensing components 1222, and the light-sensing components 1222 are distributed in the first base plate 122 below the circuit region 124a or below the ultrasonic region 124b. In this embodiment, an optional step can be applied to form a light-filtering layer 170 on the upper surface of the circuit layer 124 and correspond to the light-sensing component 1222. In this embodiment, the light-filtering layer 170 is disposed on the upper surface of the circuit layer 124. In another embodiment, the light-filtering layer 170 may be formed on a covering layer 130 in subsequent steps.

Figure 6B:
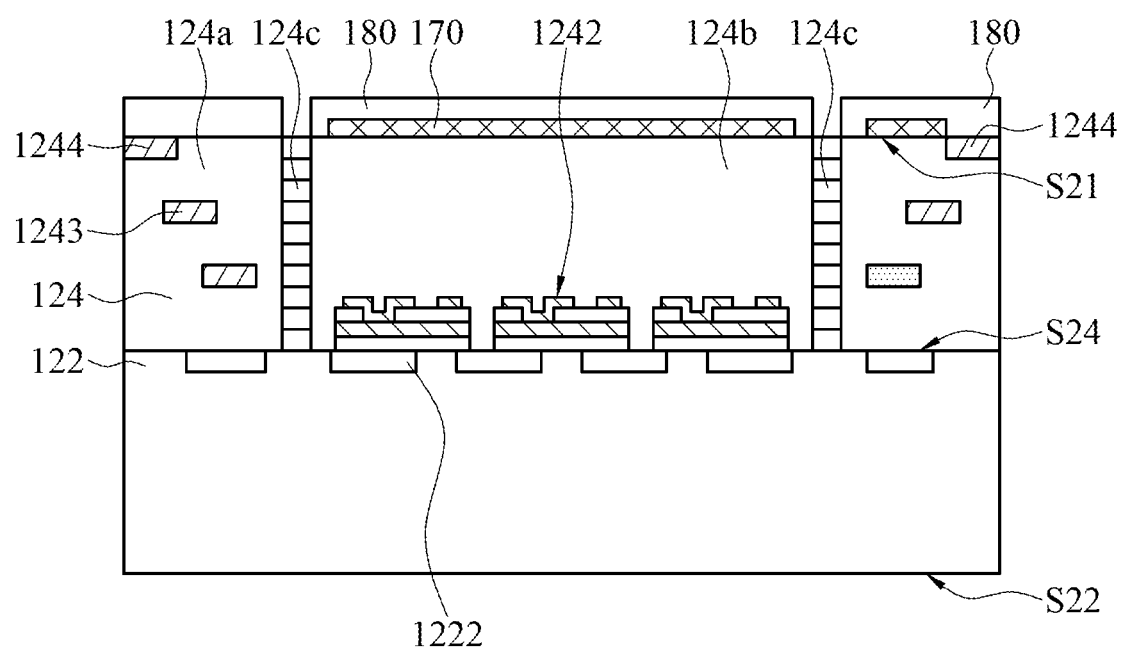

As shown in FIG. 6B, a protection layer (not shown) is formed on the upper surface of the circuit layer 124 (i.e., the top surface S21 of the composite layer 120). In the case that the upper surface of the circuit layer 124 forms the light-filtering layer 170, the protection layer also covers the light-filtering layer 170. Next, the protection layer is patterned by lithography procedures to form a patterned protection layer 180 with islanded configurations. Wherein, the patterned protection layer 180 covers parts of the upper surface of the circuit layer 124 but does not cover the first removal structure 124c exposed from the upper surface of the circuit layer 124. In one embodiment, the material of the patterned protection layer 180 (or the material of the protection layer) is a photoresist material.

Figure 6C:
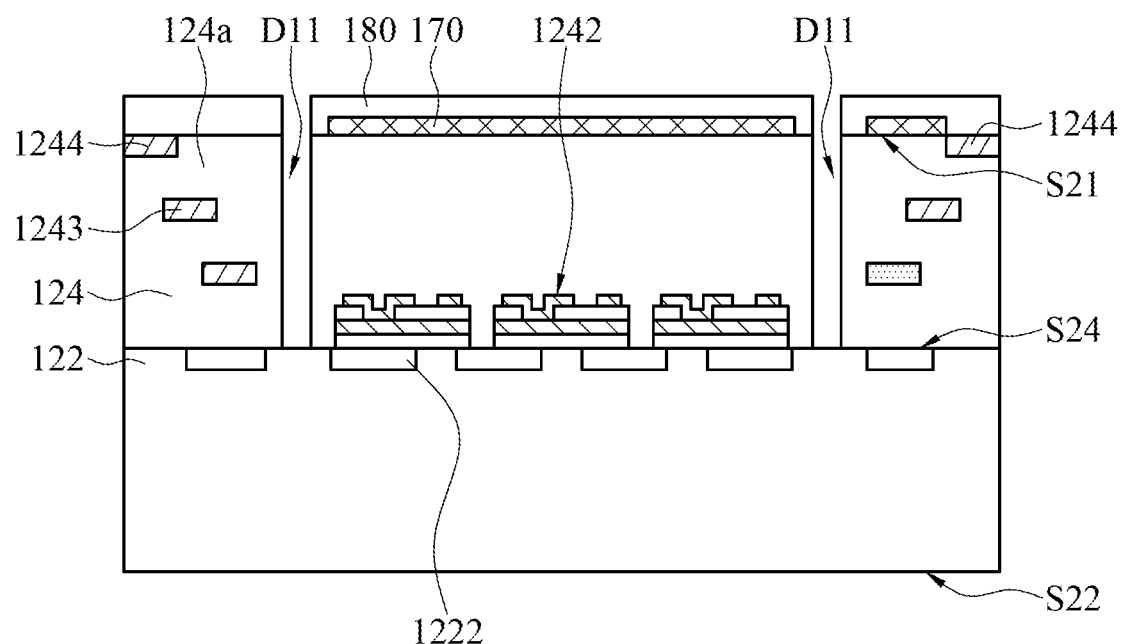

As shown in FIG. 6C, the first removal structure 124c not covered by the patterned protection layer 180 is removed by an etching procedure (e.g., a wet etching procedure) to form a first upper groove D11. Wherein, the first upper groove D11 is extending from the upper surface of the circuit layer 124 toward the lower surface of the circuit layer 124 to expose parts of the upper surface S24 of the first base plate 122.

Figure 6D:
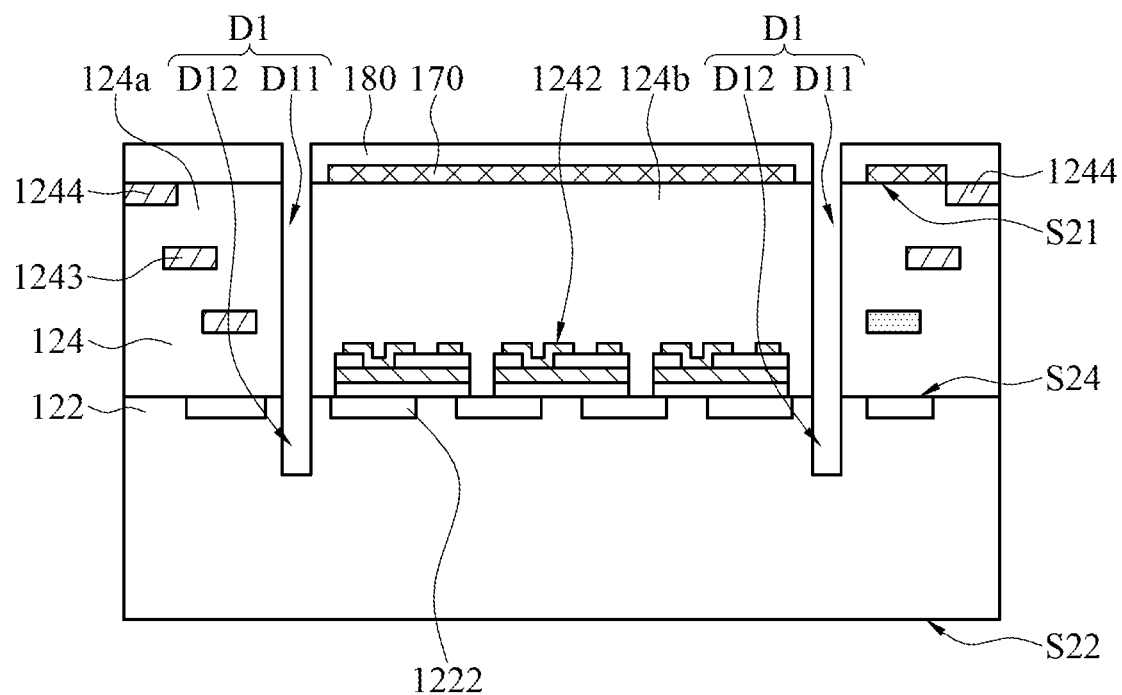

As shown in FIG. 6D, parts of the first base plate 122 is removed from the upper surface of the first base plate 122 toward the lower surface of the first base plate 122 in the first upper groove D11 by an anisotropic etching procedure (e.g., a deep reaction ion etching procedure, DRIE) to form a first lower groove D12 communicating with the first upper groove D11. In other words, the first lower groove D12 is formed by etching the first upper groove D11. Wherein, the first upper groove D11 is in communication with the first lower groove D12 to form a first groove D1. Because the first removal structure 124c surrounds a portion of the periphery of the ultrasonic region 124b rather than all parts of the periphery of the ultrasonic region 124b, the first groove D1 formed by the first upper groove D11 and the first lower groove D12 also surrounds a portion of the periphery of the ultrasonic region 124b rather than all parts of the periphery of the ultrasonic region 124b.

Figure 6E:
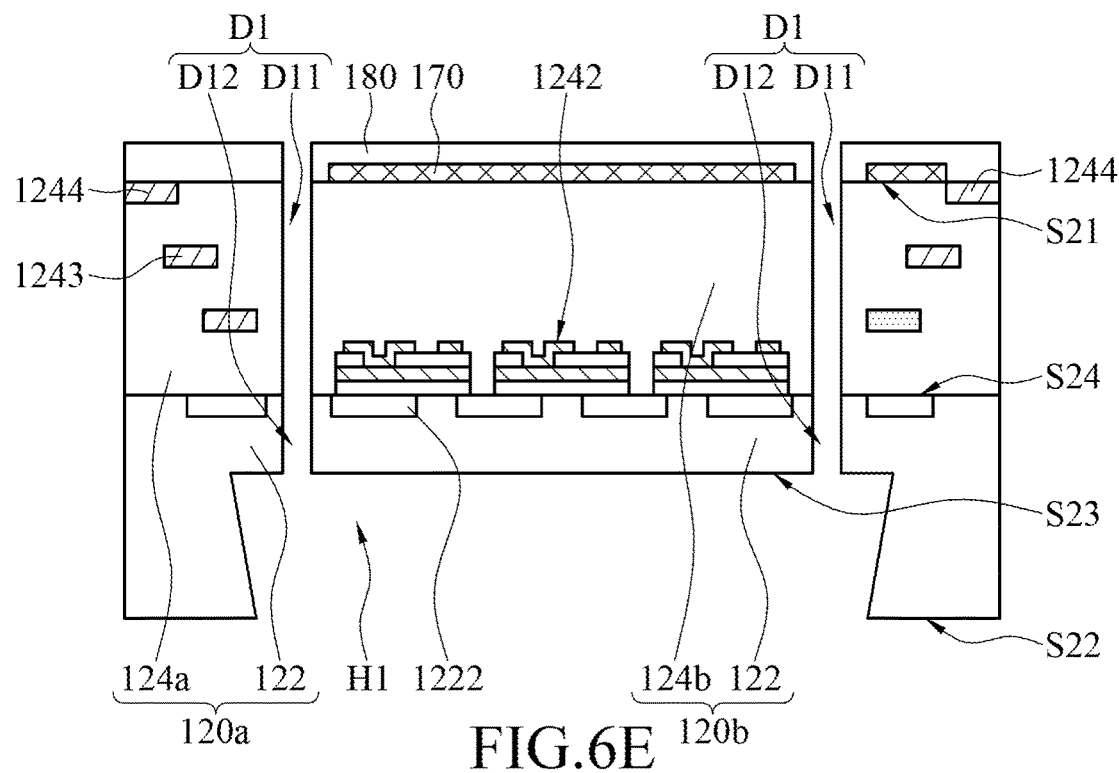

As shown in FIG. 6E, parts of the first base plate 122 corresponding to the ultrasonic region 124b is removed from the lower surface of the first base plate 122 (i.e., the bottom surface S22 of the composite layer 120) toward the upper surface of the first plate 122, to allow the lower surface of the first base plate 122 to have a recessed surface S23 corresponding to the ultrasonic region 124b. Wherein, the recessed surface S23 is in communication with the first lower groove D12. In one embodiment, parts of the first base plate 122 can be removed by using the DRIE techniques. In this embodiment, the first groove D1 divides the composite layer 120 into a circuit structure 120a (including the circuit region 124a and the first base plate 122 corresponding to the circuit region 124a) and an ultrasonic structure 120b (including the ultrasonic region 124b and the first base plate 122 corresponding to the ultrasonic region 124b), and the ultrasonic structure 120b is hangingly connected to the circuit structure 120a.

Figure 6F:
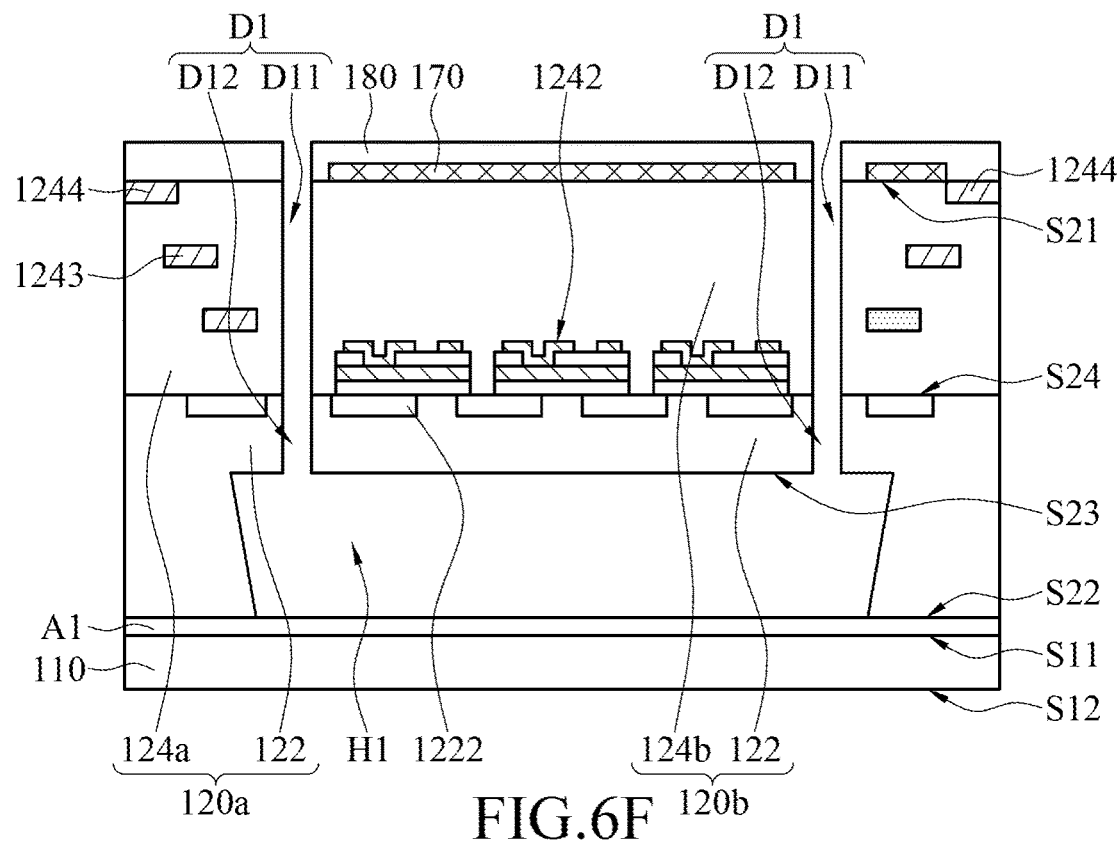

As shown in FIG. 6F, a substrate 110 is formed on the lower surface of the first base plate 122 (i.e., the bottom surface S22 of the composite layer 120). In one embodiment, the bottom surface S22 may be in contact with an upper surface S11 of the substrate 110 via adhesives, double-sided tapes, adhesive inks, adhesive paints, etc., so that a space H1 is formed between the recessed surface S23 and the upper surface S11 of the substrate 110. In this embodiment, the space H1 is in communication with the first groove D1 (i.e., the communicating first upper groove D11 and first lower groove D12).

Figure 6G:
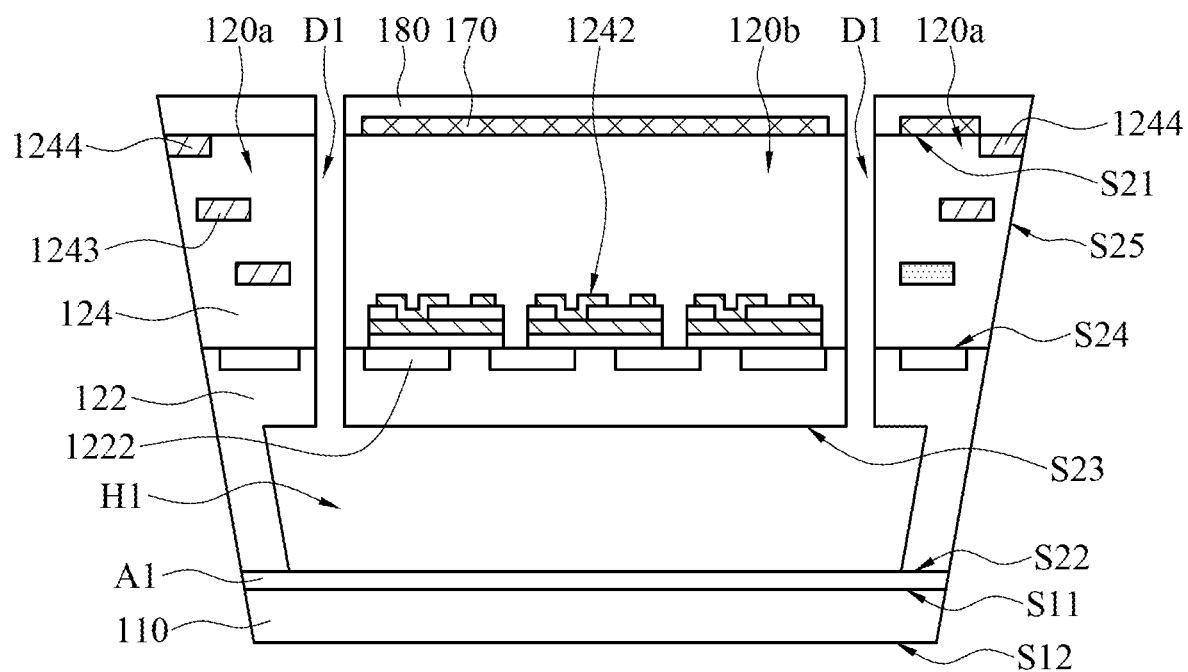

As shown in FIG. 6G, the circuit layer 124 and a lateral surface S25 of the first base plate 122 are cut. Therefore, a portion of the connection pad 1244 is exposed from a lateral surface of the circuit layer 124.

Figure 6H:
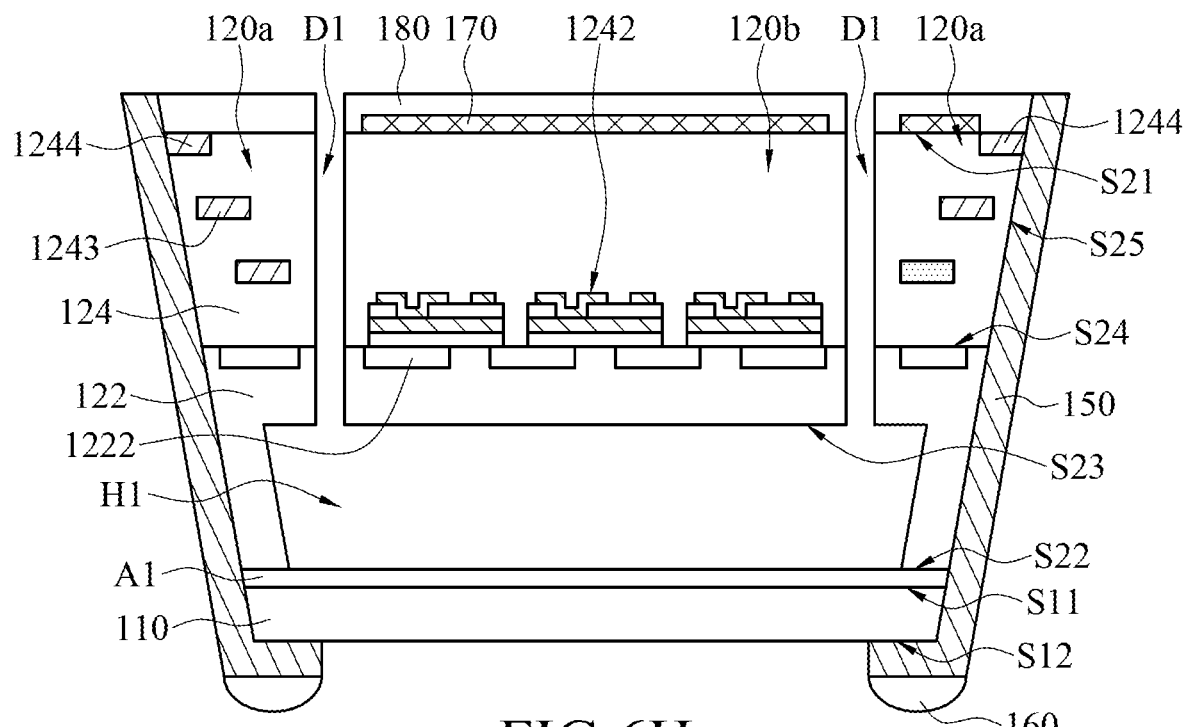

As shown in FIG. 6H, a conductor layer 150 is formed to be extending from the lateral surface S25 of the circuit layer 124 toward the lower surface S12 of the substrate 110. In one embodiment, a conductive material may be applied to cover a portion from the lateral surface S25 of the circuit layer 124 toward the lower surface S12 of the substrate 110 by sputtering, spraying, coating, or other techniques. The conductor layer 150 is electrically connected to the connection pad 1244 exposed from the lateral surface S25 of the circuit layer 124. Next, a conductive pad 160 is formed on the conductor layer 150. In this embodiment, the conductive pad 1244 may be electrically connected to the conductive pad 160 through the conductor layer 150, so that the components (e.g., ultrasonic components 1242, the circuit layout 1243, and the metal oxide semiconductor component 1245) can be electrically connected to external circuits. In one embodiment, the conductive pad 160 is above the conductor layer 150 extending toward the lower surface S12. In one embodiment, the conductive pad 160 may be a solder ball or a protrusion, and solder ball implantation procedures such as electroplating or print can be applied to form the conductive pad 160.

Please refer to FIG. 2. The covering layer 130 is assembled on the upper surface of the circuit layer 124 (i.e., the top surface S21 of the composite layer 120). In one embodiment, an adhesive layer 140 is formed between the composite layer 120 and the circuit layer 124, so that the covering layer 130 is assembled on the upper surface of the circuit layer 124 via the adhesive layer 140. For example, the adhesive layer 140 may be applied on the covering layer 130 or on the upper surface of the circuit layer 124. In the case that the patterned protection layer 180 is not removed in the manufacturing processes, the adhesive layer 140 may also be applied on the patterned protection layer 180 on the circuit layer 124. In one embodiment, the adhesive layer 140 may be an adhesive paste, a double-sided tape, an adhesive ink, an adhesive paint, etc.

Figure 7A:
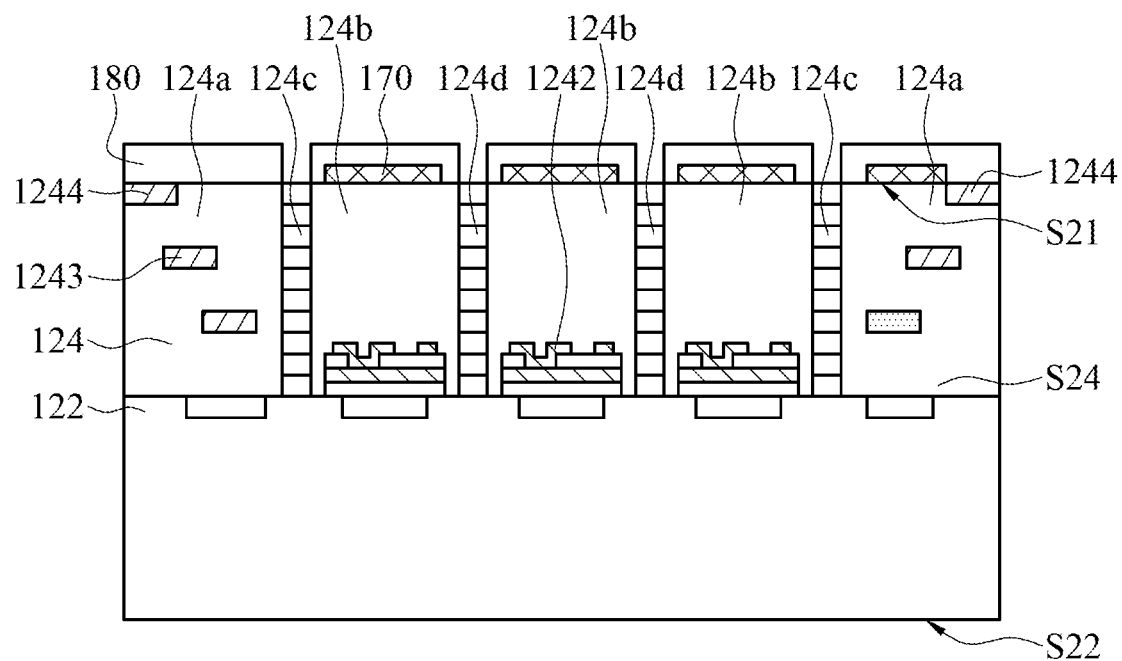
FIGS. 7A to 7D illustrate schematic views showing some steps of the manufacturing method of the ultrasonic module of the another embodiment.

FIGS. 7A to 7D illustrate schematic views showing some steps of the manufacturing method of the ultrasonic module of the another embodiment. In this embodiment, the step shown in FIG. 7A is followed after the step shown in FIG. 6A. Please refer to FIGS. 7A to 7D. In this embodiment, the circuit layer 124 further comprises second removal structures 124d, the second removal structures 124d are exposed from the upper surface of the circuit layer 124 (i.e., the top surface S21 of the composite layer 120), and the second removal structures 124d are extending from the upper surface of the circuit layer 124 toward the lower surface of the circuit layer 124. Each of the second removal structures 124d surrounds a portion of a periphery of one of the ultrasonic components 1242, and a rest portion of the periphery of the ultrasonic component 1242 is connected to other regions of the ultrasonic region 124b or connected to the circuit region 124a. In other words, one of the second removal structures 124d separates at least two adjacent ultrasonic components 1242 of the ultrasonic components 1242.

As shown in FIG. 7A, after the circuit layer 124 is formed on the upper surface S24 of the first base plate 122, a protection layer (not shown) is formed on the upper surface of the circuit layer 124 (i.e., the top surface S21 of the composite layer 120). In the case that the upper surface of the circuit layer 124 forms the light-filtering layer 170, the protection layer also covers the light-filtering layer 170. Next, the protection layer is patterned by lithography procedures to form a patterned protection layer 180 with islanded configurations. Wherein, the patterned protection layer 180 covers parts of the upper surface of the circuit layer 124 but does not cover the first removal structure 124c and the second removal structures 124d exposed from the upper surface of the circuit layer 124. In one embodiment, the material of the patterned protection layer 180 (or the material of the protection layer) is a photoresist material.

Figure 7B:
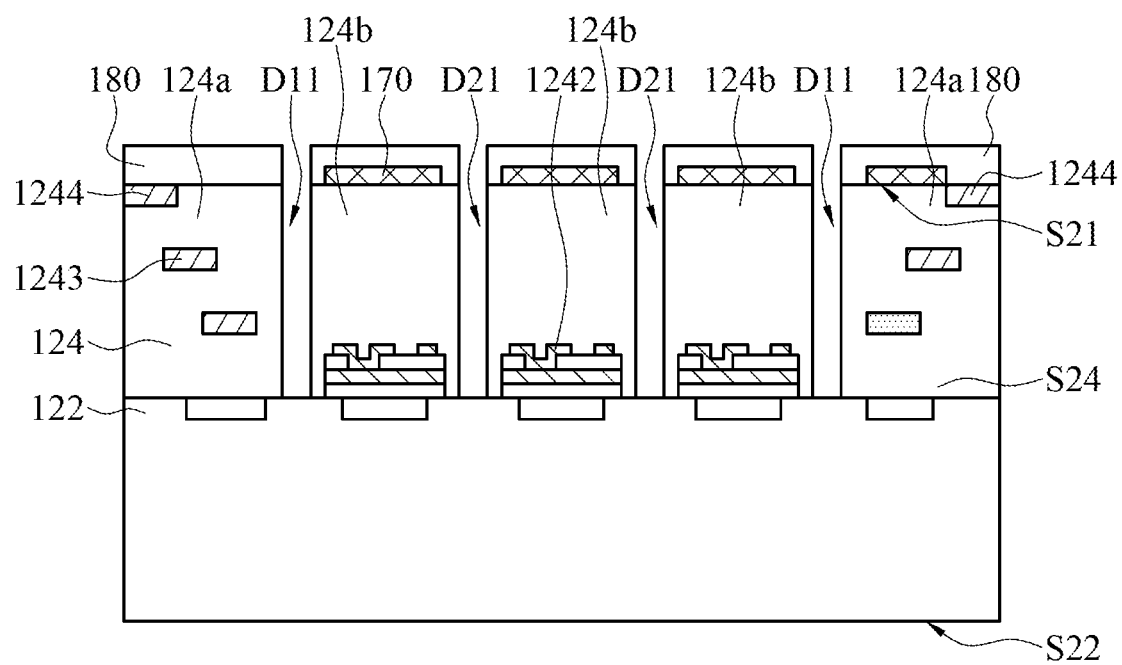

As shown in FIG. 7B, the first removal structure 124c and the second removal structures 124d not covered by the patterned protection layer 180 are removed by an etching procedure (e.g., a wet etching procedure) to form a first upper groove D11 and a second upper groove D21. Wherein, the first upper groove D11 and the second upper groove D21 are both extending from the upper surface of the circuit layer 124 toward the lower surface of the circuit layer 124 to expose parts of the upper surface S24 of the first base plate 122.

Figure 7C:
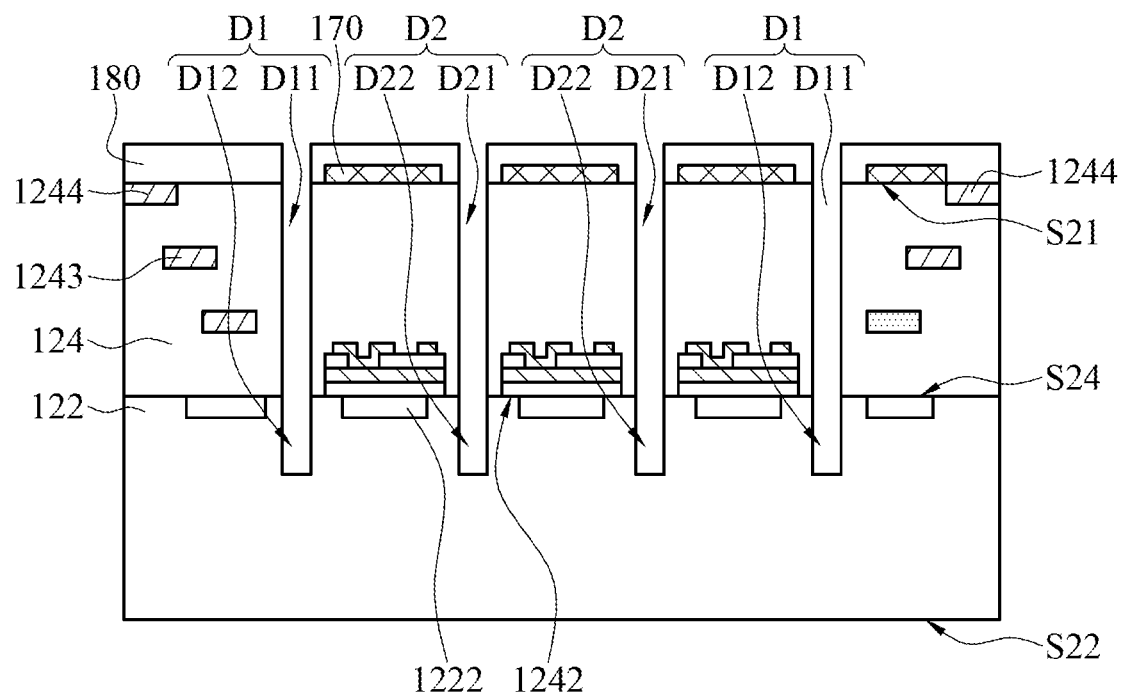

As shown in FIG. 7C, parts of the first base plate 122 is removed from the upper surface of the first base plate 122 toward the lower surface of the first base plate 122 in the first upper groove D11 by an anisotropic etching procedure (e.g., a deep reaction ion etching procedure, DRIE) to form a first lower groove D12 communicating with the first upper groove D11, and parts of the first base plate 122 is removed from the upper surface of the first base plate 122 toward the lower surface of the first base plate 122 in the second upper groove D21 by the anisotropic etching procedure to form a second lower groove D22 communicating with the second upper groove D21. In other words, the first lower groove D12 is formed by etching the first upper groove D11, and the second lower groove D22 is formed by etching the second upper groove D21. In this embodiment, the second upper groove D21 is in communication with the second lower groove D22 to form a second groove D2. Because each of the second removal structures 124d surrounds a portion of the periphery of at least one or several ultrasonic components 1242 rather than all parts of the periphery of at least one or several ultrasonic components 1242, each of the second grooves D2 formed by the second upper groove D21 and the second lower groove D22 also surrounds a portion of the periphery of at least one or several ultrasonic components 1242 rather than all parts of the periphery of at least one or several ultrasonic components 1242.

Figure 7D:
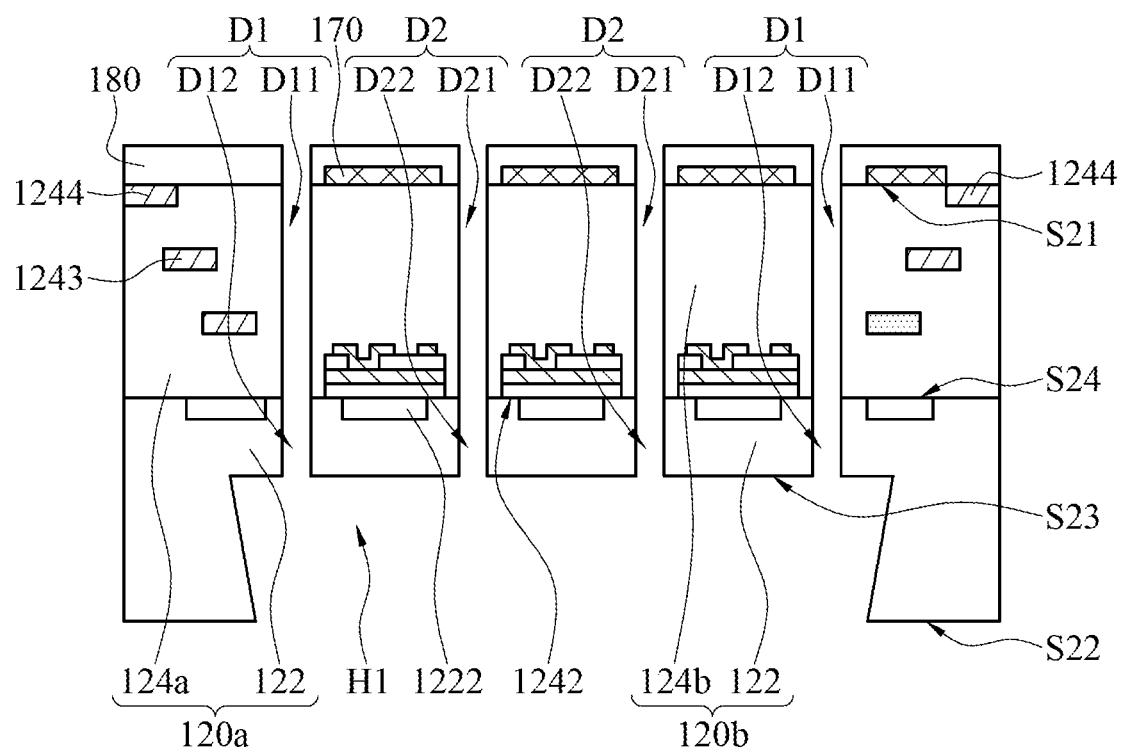

As shown in FIG. 7D, parts of the first base plate 122 corresponding to the ultrasonic region 124b is removed from the lower surface of the first base plate 122 (i.e., the bottom surface S22 of the composite layer 120) toward the upper surface of the first plate 122, to allow the lower surface of the first base plate 122 to have a recessed surface S23 corresponding to the ultrasonic region 124b. Wherein, the recessed surface S23 is in communication with the first lower groove D12 and the second lower groove D22. In this embodiment, the first groove D1 divides the composite layer 120 into a circuit structure 120a (including the circuit region 124a and the first base plate 122 corresponding to the circuit region 124a) and an ultrasonic structure 120b (including the ultrasonic region 124b and the first base plate 122 corresponding to the ultrasonic region 124b), and the ultrasonic structure 120b is hangingly connected to the circuit structure 120a. The second grooves D2 are in the ultrasonic structure 120b, and each of the second grooves D2 separates at least two adjacent ultrasonic components 1242 of the ultrasonic components 1242.

Next, steps shown in FIGS. 6F to 6H are applied for the manufacturing process of the ultrasonic module. Since these steps in this embodiment are approximately similar with that described in the foregoing paragraphs, descriptions of these steps are omitted.

Figure 8:
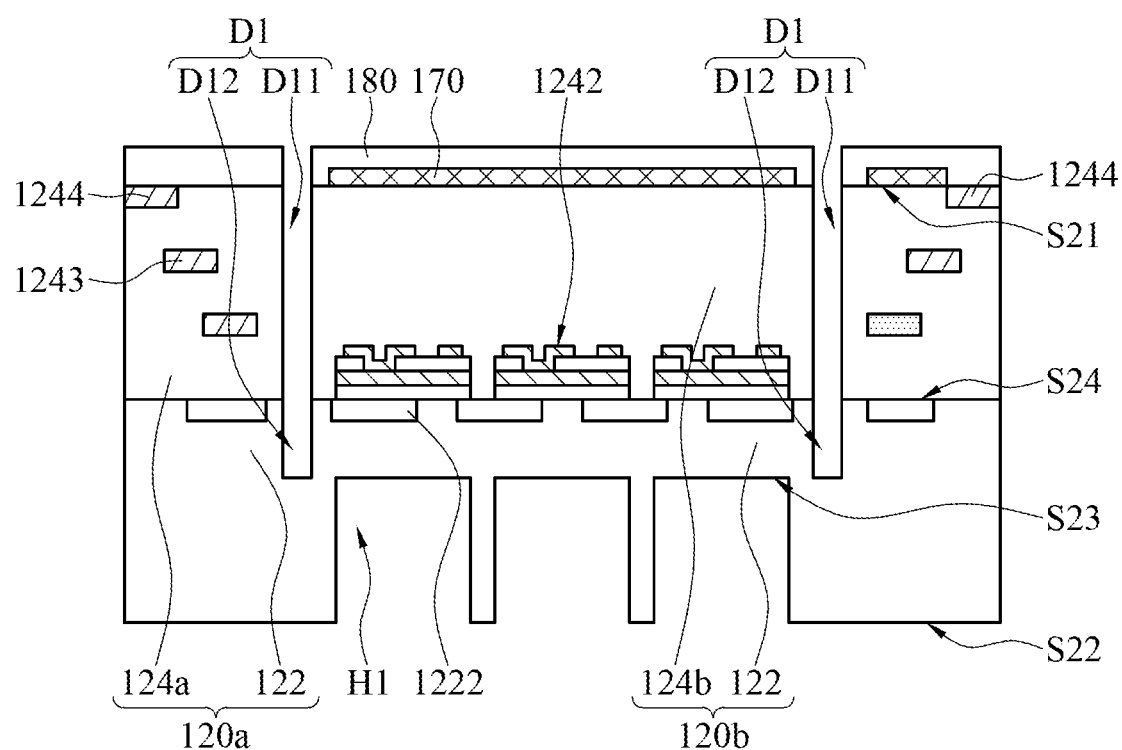
FIG. 8 illustrates a schematic view showing a step of the manufacturing method of the ultrasonic module of the further yet another embodiment.

FIG. 8 illustrates a schematic view showing a step of the manufacturing method of the ultrasonic module of the further yet another embodiment. Here, the step shown in FIG. 8 is followed after the step shown in FIG. 6D and is used for replacing the step shown in FIG. 6E. Please refer to FIG. 8, in this embodiment, in the step of removing at least one portion of the first base plate 122 corresponding to the ultrasonic region 124b, a plurality of incommunicable portions of the first base plate 122 corresponding to the ultrasonic region 124b is removed to allow the lower surface of the first base plate 122 (i.e., the bottom surface S22 of the composite layer 120) to have a plurality of recessed surfaces S23 corresponding to the ultrasonic region 124b, and the first lower groove D12 is not in communication with the recessed surfaces S23. Accordingly, in the subsequent steps (e.g., the step shown in FIG. 6F), a plurality of incommunicable spaces H1 is respectively formed between the recessed surfaces S23 and the upper surface S11 of the substrate 110 (shown in FIG. 4).

Next, steps shown in FIGS. 6G and 6H are applied for the manufacturing process of the ultrasonic module. Since these steps in this embodiment are approximately similar with that described in the foregoing paragraphs, descriptions of these steps are omitted.

According to the ultrasonic module and the manufacturing method of the ultrasonic module of the embodiments of the instant disclosure, a space is formed below the ultrasonic structure and in communication with the first groove (and/or the second groove) to form a communicating spacing extending from the top surface of the composite layer toward the upper surface of the substrate. Therefore, the communicating spacing allows the transmission speed of the first ultrasonic signal to be different from the transmission speed of the second ultrasonic signal, so that the second ultrasonic signal can be distinguished and removed, and the first ultrasonic signal can be received. Therefore, the first ultrasonic signal can be used for recognizing the fingerprint on the covering layer without the interference from the second ultrasonic signal, so that the accuracy of the fingerprint recognition can be improved.

What is claimed is:

1. An ultrasonic module comprising:
    a substrate having an upper surface and a lower surface opposite to the upper surface;
    a composite layer having a top surface, a bottom surface, and a recessed surface recessed toward the bottom surface, wherein the bottom surface is on the upper surface of the substrate, at least one space is formed between the recessed surface and the upper surface, the composite layer has at least one first groove, the at least one first groove is extending from the top surface toward the recessed surface, and the at least one first groove separates the composite layer into a circuit structure and an ultrasonic structure connected to the circuit structure, the ultrasonic structure corresponds to the recessed surface; and
    a covering layer assembled on the top surface of the composite layer.

2. The ultrasonic module according to claim 1, wherein the composite layer comprises at least one light-sensing component, the at least one light-sensing component is below the circuit structure or below the ultrasonic structure.

3. The ultrasonic module according to claim 2, further comprising at least one light-filtering layer, wherein the at least one light-filtering layer is on the top surface of the composite layer and corresponds to the at least one light-sensing component.

4. The ultrasonic module according to claim 1, wherein the at least one first groove is in communication with the at least one space, the ultrasonic structure is above the at least one space and hangingly connected to the circuit structure, a projection of the ultrasonic structure is overlapping on a projection of the at least one space in an orthogonal projecting direction of the substrate.

5. The ultrasonic module according to claim 1, wherein the ultrasonic structure comprises a plurality of ultrasonic components, a plurality of the spaces is formed between the recessed surface and the upper surface, the ultrasonic structure is above the spaces and the spaces respectively corresponds to the ultrasonic components.

6. The ultrasonic module according to claim 4, wherein the ultrasonic structure comprises a plurality of ultrasonic components, and the composite layer further comprises at least one second groove, the at least one second groove is in the ultrasonic structure, the at least one second groove is extending from the top surface toward the recessed surface to be in communication with the at least one space, and the at least one second groove separates at least two adjacent ultrasonic components of the ultrasonic components.

7. The ultrasonic module according to claim 1, further comprising an adhesive layer, the adhesive layer is between the covering layer and the composite layer, and the covering layer is assembled on the top surface of the composite layer via the adhesive layer.

8. The ultrasonic module according to claim 1, wherein the circuit structure comprises a connection pad, the connection pad is exposed from a lateral surface of the composite layer, the ultrasonic module further comprises a conductor layer and a conductive pad, the conductor layer is on the lateral surface of the composite layer and extending toward the lower surface of the substrate, the conductive pad is on the lower surface, the conductor layer is electrically connected to the connection pad and the conductive pad.

9. The ultrasonic module according to claim 1, wherein the composite layer comprises a plurality of ultrasonic components aligned as a two-dimensional array, each of the ultrasonic components comprises:
 a first piezoelectric layer;
 a second piezoelectric layer on the first piezoelectric layer, the second piezoelectric layer has a contact hole;
 a first electrode between the first piezoelectric layer and the second piezoelectric layer, wherein the contact hole exposes parts of the first electrode;
 a second electrode on the second piezoelectric layer, wherein the second electrode is in contact with the first electrode through the contact hole; and
 a third electrode on the second piezoelectric layer.

10. A manufacturing method for an ultrasonic module, comprising:
 forming a circuit layer on a first base plate, wherein the circuit layer is on an upper surface of the first base plate, the circuit layer comprises a circuit region, an ultrasonic region, and at least one first removal structure, the at least one first removal region is exposed from an upper surface of the circuit layer and extending form the upper surface of the circuit layer toward a lower surface of the circuit layer, a portion of a periphery of the ultrasonic region is surrounded by the at least one first removal structure, and a rest portion of the periphery of the ultrasonic region is connected to the circuit region;
 forming a patterned protection layer to cover parts of the upper surface of the circuit layer but not to cover the at least one first removal structure exposed from the upper surface of the circuit layer;
 removing the at least one first removal structure to form a first upper groove;
 removing parts of the first base plate in the first upper groove from the upper surface of the first base plate toward the lower surface of the first base plate to form a first lower groove communicating with the first upper groove;
 removing at least one portion of the first base plate corresponding to the ultrasonic region from the lower surface of the first base plate toward the upper surface of the first base plate to allow the lower surface of the first base plate to have at least one recessed surface corresponding to the ultrasonic region;
 forming a substrate on the lower surface of the first base plate to allow at least one space to be formed between the recessed surface and an upper surface of the substrate; and
 assembling a covering layer on the upper surface of the circuit layer.

11. The manufacturing method according to claim 10, wherein the step of removing at least one portion of the first base plate corresponding to the ultrasonic region comprises removing the at least one portion of the first base plate corresponding ultrasonic region to allow the first lower groove to be in communication with the recessed surface, wherein the at least one space is formed between the recessed surface and the upper surface of the substrate.

12. The manufacturing method according to claim 10, wherein the step of removing at least one portion of the first base plate corresponding to the ultrasonic region comprises removing a plurality of incommunicable portions of the first base plate corresponding to the ultrasonic region to allow the lower surface of the first base plate to have a plurality of the recessed surfaces corresponding to the ultrasonic region, wherein the first lower groove is not in communication with the recessed surfaces, a plurality of the spaces is respectively formed between the recessed surfaces and the upper surface of the substrate, and the spaces are not in communication with each other.

13. The manufacturing method according to claim 10, further comprising:
 cutting a lateral surface of the circuit layer and a lateral surface of the first base plate to expose a connection pad of the circuit layer;
 forming a conductor layer extending from the lateral surface of the circuit layer toward a lower surface of the substrate opposite to the upper surface of the substrate; and
 forming a conductive pad on the conductor layer, wherein the conductor layer is electrically connected to the connection pad and the conductive pad.

14. The manufacturing method according to claim 10, further comprising:
 forming a light-filtering layer on the upper surface of the circuit layer before the covering layer is assembling on parts of the upper surface of the circuit layer, wherein the circuit layer comprises at least one light-sensing component, the at least one light-sensing component is below the circuit structure or below the ultrasonic structure, the light-filtering layer is on the top surface of the composite layer and corresponds to the at least one light-sensing component.

15. The manufacturing method according to claim 10, further comprising:
 removing a second removal structure to form a second upper groove when the at least one first removal structure is being removed, wherein the second removal structure is in the ultrasonic structure and exposed from the upper surface of the circuit layer, and the second removal structure is extending from the upper surface of the circuit layer toward the lower surface of the circuit layer, the ultrasonic region comprises a plurality of ultrasonic components, a portion of a periphery of one of the ultrasonic components is surrounded by the second removal structure, and a rest portion of the periphery of the ultrasonic component is connected to the circuit region; and
 removing parts of the first base plate in the second upper groove from the upper surface of the first base plate toward the lower surface of the first base plate to form a second lower groove communicating with the second upper groove, wherein the second lower groove is in communication with the recessed surface.

16. The manufacturing method according to claim 10, further comprising:
 forming an adhesive layer between the composite layer and the circuit layer, wherein the covering layer is assembled on the upper surface of the circuit layer via the adhesive layer.

* * * * *